United States Patent [19]

Balderes et al.

[11] Patent Number: 4,628,411
[45] Date of Patent: Dec. 9, 1986

[54] APPARATUS FOR DIRECTLY POWERING A MULTI-CHIP MODULE FROM A POWER DISTRIBUTION BUS

[75] Inventors: Demetrios Balderes, Wappingers Falls; Andrew J. Frankovsky, Endwell; Robert A. Jarvela, Wappingers Falls, all of N.Y.

[73] Assignee: International Business Machines Corporation, Armonk, N.Y.

[21] Appl. No.: 729,831

[22] Filed: May 2, 1985

Related U.S. Application Data

[63] Continuation of Ser. No. 588,610, Mar. 12, 1984, abandoned.

[51] Int. Cl.[4] .............................................. H05K 5/00
[52] U.S. Cl. .................................... 361/414; 361/407; 361/410
[58] Field of Search ............ 339/17 L, 17 LM, 17 M, 339/17 C, 17 CF, 17 E; 174/52 FP, 68.5; 361/395, 396, 400, 403, 407, 409, 410, 412, 413, 414, 416

[56] References Cited

U.S. PATENT DOCUMENTS

| | | | |
|---|---|---|---|
| 3,370,203 | 2/1968 | Fravitz | 361/396 |
| 3,403,300 | 9/1968 | Horowitz | 361/414 |
| 3,418,535 | 12/1968 | Martinell | 361/414 |
| 3,495,134 | 2/1970 | Collins | 361/407 |
| 3,519,959 | 7/1970 | Bewley | 361/413 |
| 3,628,095 | 12/1971 | Schwartz | 361/407 |
| 4,047,132 | 9/1977 | Krajewski | 361/414 |
| 4,109,299 | 8/1978 | Consentino | 361/412 |
| 4,150,421 | 4/1979 | Nishihara | 361/414 |
| 4,410,927 | 10/1983 | Batt | 361/414 |
| 4,514,784 | 4/1985 | Williams | 361/396 |

OTHER PUBLICATIONS

"Multiple LSI Silicon Chip Modules—Surfaces", Ho, IBM Tech. Discl. Bull., vol. 22, No. 8A, Jan. 1980, pp. 3410.

Primary Examiner—G. P. Tolin
Attorney, Agent, or Firm—John H. Bouchard

[57] ABSTRACT

A direct module powering scheme is disclosed. A plurality of integrated circuit chips are mounted on a module. The module is mounted on a printed circuit board. A plurality of metallization layers are distributed in parallel fashion within the module. A voltage tab is mounted on the edge of the module substrate and in contact with the edge of the metallization layers. The voltage tab may be attached to a source of power for providing the necessary voltage and current to the module needed to power the chips mounted on the module. The metallization layers comprise voltage distribution layers and voltage reference (ground) layers. The voltage tab is connected to the edge of the voltage distribution layer. A plurality of plated vias are disposed through the module in contact with one or more of the metallization layers. A plurality of voltage distribution stripes are disposed on the bottom of the module substrate and in contact with the plated vias for providing the necessary voltage and current to remotely-located chips, relative to the voltage tab, needed to power the chips. The energizing current from the power source energizes the chips mounted on the module by way of the voltage tab, the voltage distribution layer, and a plated via. Alternatively, the energizing current from the power source energizes a remotely-located chip mounted on the module by way of the voltage tab, the voltage distribution layer, a plated via, a voltage distribution stripe, and another plated via connected to the remotely-located chip. As a result, the module is connected directly to the power source, rather than being connected to the power source by way of a plurality of power distribution planes disposed within the printed circuit board.

5 Claims, 12 Drawing Figures

SEC. B-B

APPARATUS FOR DIRECTLY POWERING A MULTI-CHIP MODULE FROM A POWER DISTRIBUTION BUS

This application is a continuation, of application Ser. No. 588,610, filed Mar. 12, 1984, now abandoned.

BACKGROUND OF THE INVENTION

1. Field of the Invention

The present invention pertains to printed circuit board packaging technology, and, more particularly, to a method and apparatus for powering a module, mounted on the printed circuit board, directly from a power distribution bus rather than powering the module from the power distribution bus by way of the printed circuit board.

2. Description of the Prior Art

The computers of the future will require a high throughput performance. High performance is measured in terms of cycle time and the number of cycles per instruction. However, in order to achieve this high performance, the number of circuits on an integrated circuit chip must increase. Consequently, the number of integrated circuit chips must also increase. The introduction of high density integrated circuit packages, such as a Thermal Conduction Module, has provided for the increased number of integrated circuit chips necessary to produce the required high performance.

However, with the introduction of these high density integrated circuit packages, two undesirable side effects are noticeable: (1) the power dissipated by a package is higher than previously experienced, and (2) the required current supplied to the package has increased significantly. These high circuit density integrated circuit packages necessitate the use of a large number of input/output (non-signal) pins to power the chips and to maintain power losses and voltage drops at reasonable levels. This requirement for more pins is compounded by the simultaneous demand for an increased number of input/output signal pins required to conduct the necessary signals to the increased number of circuits on the chips.

Furthermore, the demand for an increased number of circuits renders difficult the design of a modular or granular system. If a system is highly modular or granular in nature, it is easy to maintain and service by field representatives.

In prior art printed circuit board packaging system designs, a module, such as module 10 shown in FIG. 1, has a plurality of integrated circuit chips 10a mounted thereon. Referring to FIG. 2, the module 10 is mounted on a printed circuit board 12, the module being connected to various power distribution planes 12a within the board. The planes 12a are connected to a power distribution bus 14 thereby carrying the required current and providing the required voltage to the module 10 as necessary to power the chips 10a mounted on the module. The module 10 includes a multitude of input/output pins 10b connected to the power distribution planes 12a in the printed circuit board 12 for conducting the voltage and current to the chips 10a. Since the number of circuits on a chip has increased and the number of chips mounted on a module has increased in response to the demand for increased performance of large-scale computers, the number of required pins on the module has also increased, these pins including signal pins to provide the necessary information signal to the chips and power distribution pins to provide the necessary voltage and current to power the chips. Since the number of required pins has increased, the number of power distribution planes in the printed circuit board also increased. Therefore, the thickness of the board has increased. As a result of the increased board thickness, greater power losses are experienced. Board manufacturing complexity also increases as board thickness increases.

Furthermore, due to the increased number of pins, the module must be larger to accommodate the required number of pins. However, the trend, in the design of a computer system, is toward miniaturization of computer system components, not toward enlarging the size of these components.

Therefore, the prior art packaging system could not meet the demand for an increased number of circuits and a resultant increase in the number of integrated circuit chips mounted on a module and, simultaneously, minimize its power losses as well as meet the demand for the miniaturization of computer system components. Another packaging system design is needed to simultaneously achieve the following desired objectives, that is, to increase the performance associated with a computer system, to minimize the power losses associated with the computer system components, and to maintain the trend toward the miniaturization of the computer system components.

SUMMARY OF THE INVENTION

Accordingly, it is a primary object of the present invention to provide another printed circuit board packaging system design capable of achieving the above mentioned desired objectives.

It is another object of the present invention to provide another printed circuit board packaging system design involving a direct module powering approach for powering the integrated circuit chips on a module whereby the module is powered directly from the power distribution bus via voltage tabs mounted on the edge of the module substrate rather than from the bus via the power distribution planes within the board and the input/output pins mounted on the bottom of the module substrate.

These and other objects of the present invention are fulfilled by utilizing a direct module powering approach for powering the integrated circuit chips mounted on a module connected to a printed circuit board. The substrate of the module includes a plurality of voltage distribution planes extending longitudinally and transversely through the substrate, the planes being connected to one or more voltage tabs mounted on the edge of the module substrate. The voltage tabs are connected directly to a power distribution bus. Input/output signal pins are disposed on the bottom surface of the module substrate for the conduction of a required signal to the module integrated circuit chips. Input/output power distribution pins are not needed on the bottom surface of the module substrate for powering the chips. One or more voltage distribution stripes are disposed on the bottom surface of the module substrate, supplementing the voltage distribution planes internal to the module, for powering a remotely-located chip. Consequently, in spite of the increased number of circuits on a chip, and the increased number of chips needed for the required high performance of the computer system, fewer pins are needed on the bottom surface of the module substrate than was previously required. The power losses associated with the powering of the chips on the module are kept at a minimum and the small size of the module is maintained.

In addition, since there is an increasing need for more signal pins on modules to conduct desired voltage signals to the module chips, and since power distribution pins are no longer needed by the modules, more signal pins may by disposed on the bottom surface of the module for the conduction of required voltage signals to the module chips.

Further scope of applicability of the present invention will become apparent from the detailed description presented hereinafter. It should be understood, however, that the detailed description and the specific examples, while representing a preferred embodiment of the invention, are given by way of illustration only, since various changes and modfications within the spirit and scope of the invention will become obvious to one skilled in the art from a reading of the following detailed description.

BRIEF DESCRIPTION OF THE DRAWINGS

A full understanding of the present invention will be obtained from a reading of the detailed description given hereinbelow and the accompanying drawings, which are given by way of illustration only, and thus are not limitative of the present invention, and wherein.

DETAILED DESCRIPTION OF THE PREFERRED EMBODIMENT

Figure 1:
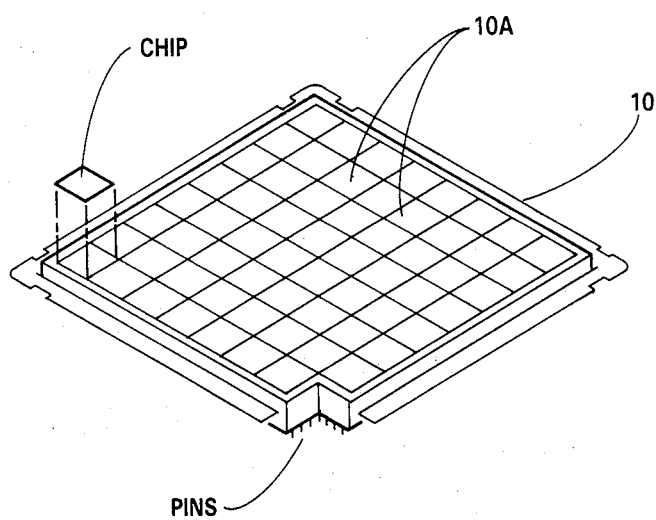
FIG. 1 illustrates a conventional thermal conduction module including a plurality of integrated circuit chips disposed thereon, and including a multitude of input/output pins disposed on its bottom surface.
Figure 2:
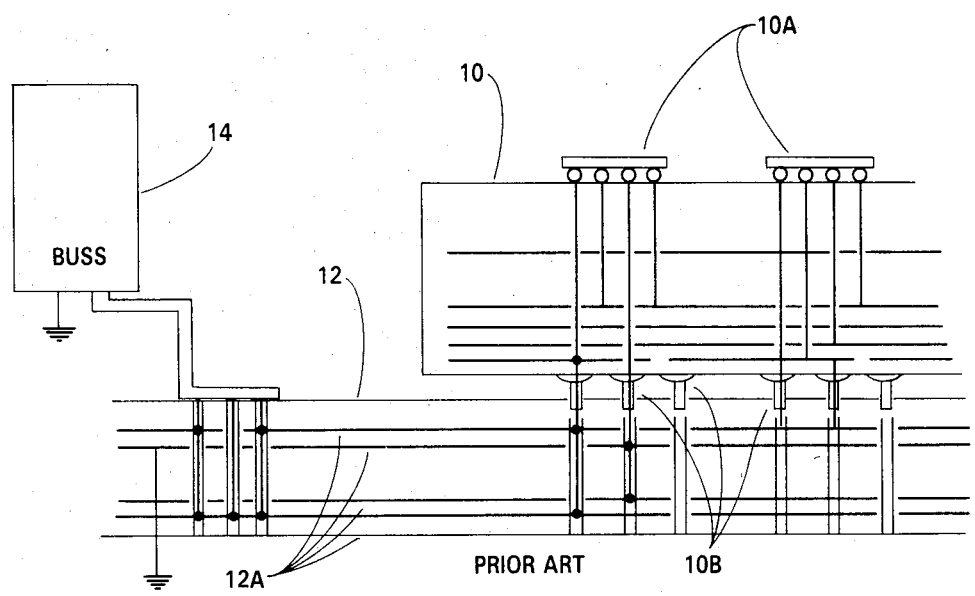
FIG. 2 illustrates a cross sectional view of a prior art package voltage distribution system.
Figure 3:
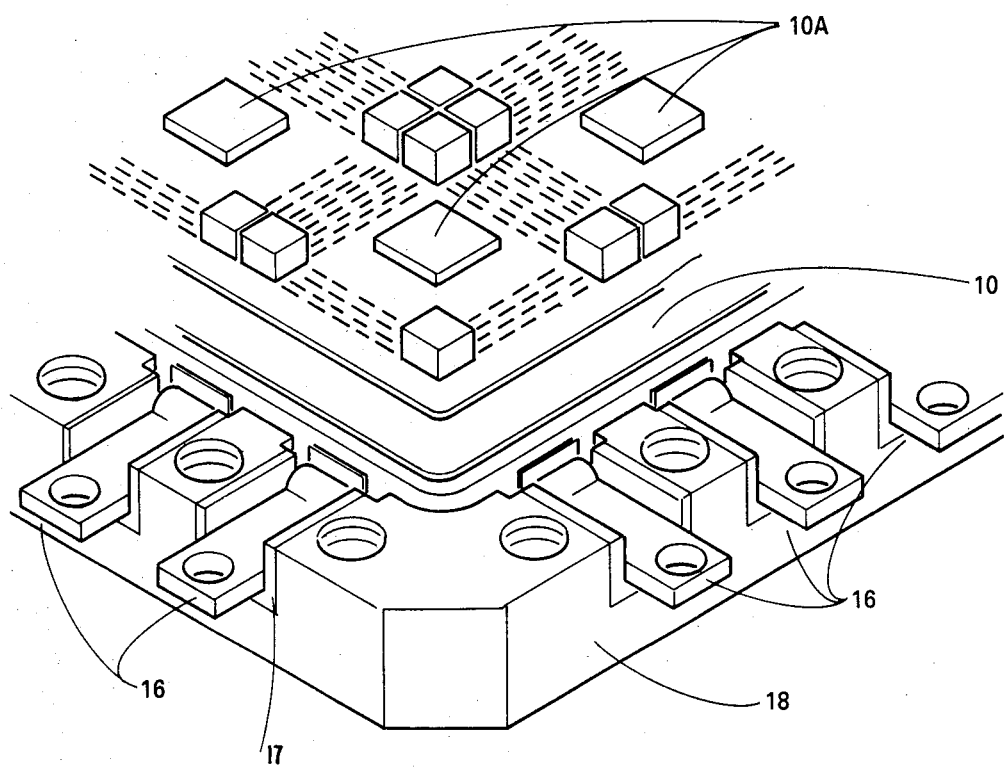
FIG. 3 illustrates the thermal conduction module of FIG. 1 including a plurality of voltage distribution tabs connected to the edge of the module substrate for conducting a voltage and current to the integrated circuit chips mounted thereon needed to power the chps.

Referring to FIG. 3, a perspective view of a module 10 is illustrated. In contrast with FIG. 1, according to the present invention, a plurality of voltage distribution tabs 16 are connected to the edge of the module substrate for conducting a voltage and a current to the integrated circuit chips 10a disposed on the module 10.

The voltage and the current is needed to power the chips. Each of the tabs 16 connect to a base plate 18 via an insulating material 17.

Figure 4:
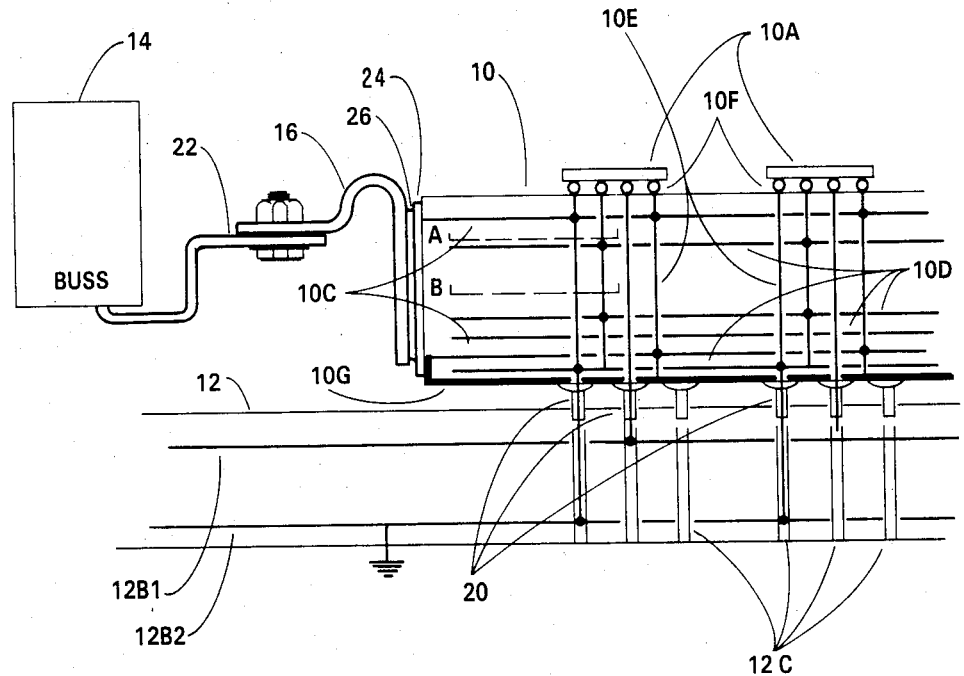
FIG. 4 illustrates a cross sectional view of a printed circuit board and a module mounted thereon, and, in particular, illustrates the direct module powering concept of the present invention.

Referring to FIG. 4, the direct module powering concept according to the present invention is illustrated. In FIG. 4, a printed circuit board 12 is illustrated. A module 10 is mounted on the board 12 and is connected thereto via a plurality of signal distribution input/output (I/O) pins 20. A voltage tab 16 is shown connected to the edge of the substrate of module 10. The voltage tab 16 is connected directly to a power distribution bus 14 via a power feed tab 22. The module 10 includes a plurality of voltage distribution planes 10c extending longitudinally and transversely through the module, each plane being substantially parallel to each other plane within the module. The voltage tabs 16 are connected to the edges of one or more of the voltage distribution planes 10c via a metallic interface 24 and a brazing compound 26 disposed between the metallic interface 24 and the voltage tab 16. The tab 16 comprises a copper-carbon composite or other suitable material with compatible physical and electrical properties. The module 10 also includes one or more voltage reference (or ground) planes 10d extending longitudinally and transversely through the module, each of the voltage reference planes being substantially parallel to each of the other planes within the module. A plurality of plated vias 10e extend orthogonally through the module 10, the vias being an electrical conducting material, such as copper. The electrical conducting material associated with each via 10e electrically connects the selected voltage distribution planes 10c to chips 10a and connects the selected voltage reference planes 10d to chips 10a thereby providing an electrical conducting path between the voltage distribution plane 10c, the chips 10a, and the voltage reference plane 10d. A plurality of voltage distribution stripes 10g are disposed on the bottom surface of the module 10 and are connected to selected plated vias 10e for providing an alternate path for the required voltage and current from voltage tab 16 necessary to power the chips 10a disposed on the module 10. Alternatively, tab 16 may be directly connected to stripes 10g in order to provide an additional conduction path.

For example, in order to power a remotely-located chip 10a on the module 10 using the voltage distribution stripe 10g, the current is conducted along a path consisting of a voltage tab 16, the brazing compound 26, the metallic interface 24, a voltage distribution plane 10c, a plated via 10e, a voltage stripe 10g, another plated via 10e, and the remotely-located chip 10a. A plurality of integrated circuit chips 10a are connected to the plated vias 10e via solder balls 10f for providing the electrical communication path between the chips 10a and the vias 10e.

In order to power a chip 10a on the module 10 without using the voltage distribution stripe 10g, a voltage tab 16 is connected to the chip 10a via the brazing compound 26, the metallic interface 24, the voltage distribution plane 10c, the plated via 10e, and the solder ball. To provide a return path for current to a ground connection, the chip 10a is connected to another voltage tab 16 via the solder ball 10f, the plated via 10e, the voltage reference (ground) plane 10d, the metallic interface 24, and the brazing compound 26.

In FIG. 4, the printed circuit board 12 includes a plurality of voltage planes 12b. These planes 12b include voltage and current signal planes, such as plane 12b1, connected to a source of signal current and at least one ground plane, such as plane 12b2, connected to a ground potential. The signal planes are used to carry the signal current to the integrated circuit chips 10a via the pins 20 and the ground plane is used to carry the return signal current from the chips to ground via pins 20. The board 12 includes a plurality of plated vias 12c. When the module 10 is mounted on the board 12, the pins 20 are disposed within the plated vias 12c. The vias 12c provide an electrical communication path between the pins 20 and the voltage planes 12b.

Figure 5A:
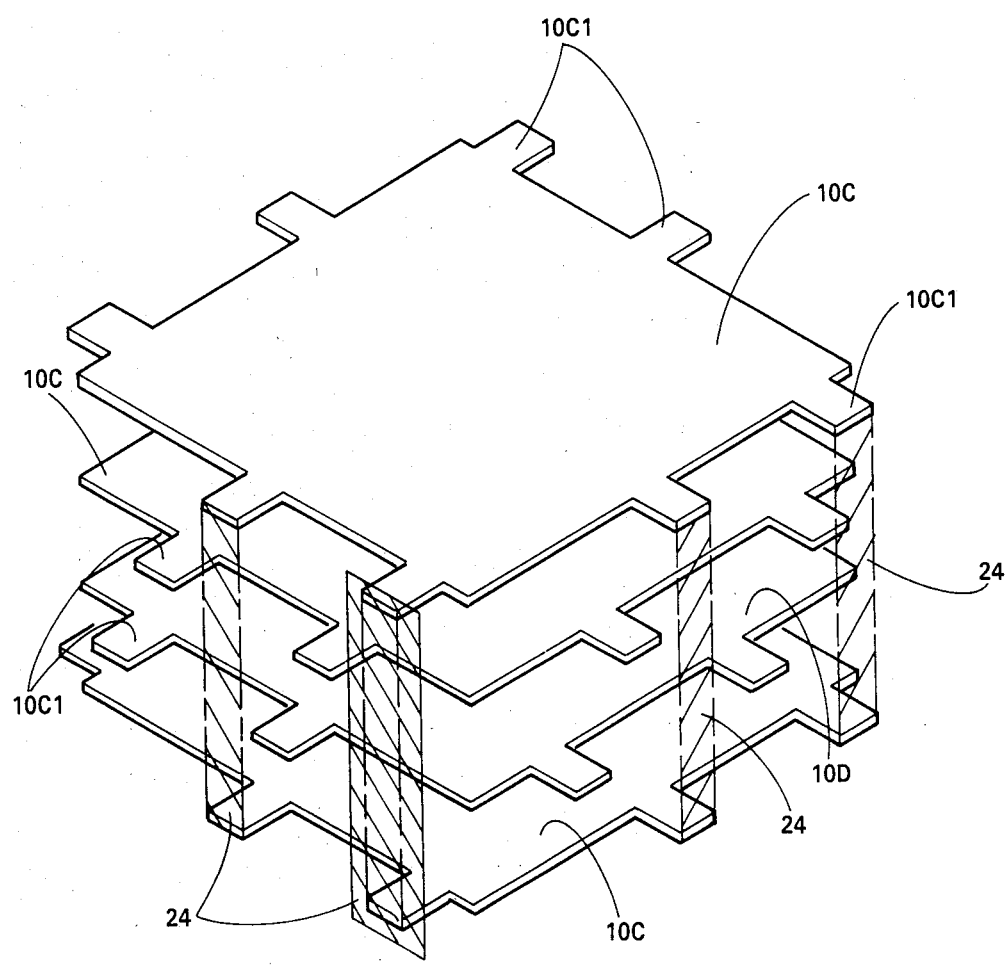
FIG. 5a illustrates a perspective view of a plurality of voltage distribution planes disposed within the module illustrated in FIG. 4.

Referring to FIG. 5a, a perspective view of a plurality of voltage distribution planes 10c and at least one voltage reference plane 10d is illustrated. In FIG. 5a, each of the planes 10c and 10d include a plurality of extended tabs 10c1 disposed on each of the four sides thereof for communicating electrically with a voltage tab 16. Each extended tab 10c1 is in contact with the metallic interface 24 of FIG. 4. As shown in FIG. 4, the metallic interface 24 is connected to a voltage tab 16 via the brazing compound 26. The voltage tab 16 is exposed to a particular voltage potential for energizing the integrated circuit chips disposed on the module 10. As shown in FIG. 5a, the metallic interface 24 may be disposed in contact with two of the extended tabs 10c1. In this way, the voltage planes 10c, having the extended tabs 10c1 in contact with the metallic interface 24, will each be exposed to the same voltage potential as carried by the voltage tab 16 connected thereto.

Figure 5B:
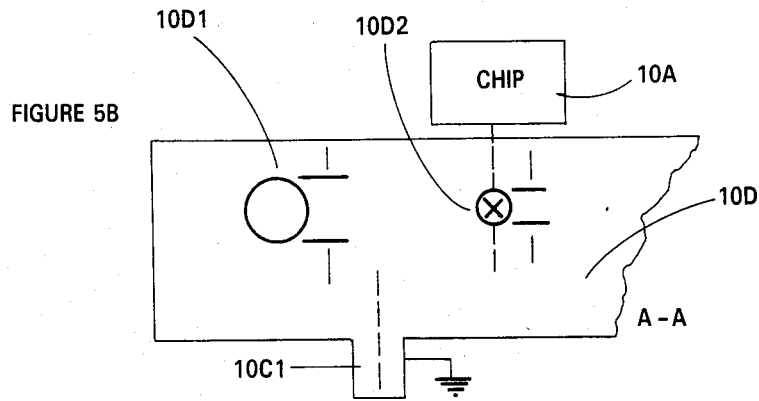
FIGS. 5b and 5c illustrate a bottom view of the voltage distribution layer 10c and the voltage reference layer 10d taken along section lines A—A and B—B shown in FIG. 4.
Figure 5C:
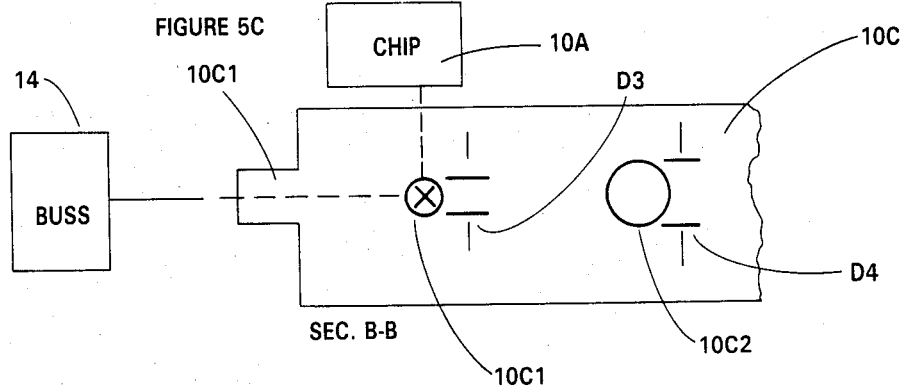

Referring to FIGS. 5b and 5c, a bottom view of the voltage distribution metallization layer 10c and the voltage reference metallization layer 10d, taken along section lines A—A and B—B shown in FIG. 4, is illustrated. In FIG. 5b, a bottom view of the voltage reference layer 10d is shown, the layer including a through hole 10d1 and a through hole 10d2. Through hole 10d1 has a diameter d1 whereas through hole 10d2 has a diameter d2. In FIG. 5b, diameter d1 is greater than diameter d2. Diameter d2 is smaller since electrical contact must be made with a metallic plating in its via 10e in order to provide a return path for current from chip 10a. The current returns to ground potential via extended tab 10c1. In FIG. 5c, a bottom view of the voltage distribution layer 10c is shown, the layer including a through hole 10c1 and a through hole 10c2. Through hole 10c1 has a diameter d3 whereas through hole 10c2 has a diameter d4. In FIG. 5c, diameter d4 is greater than diameter d3. Diameter d3 is smaller since electrical contact must be made with a metallic plating in its via 10e in order to provide a path for current from the power distribution bus 14 to chip 10a. Since diameters d1 and d4 are larger than diameters d2 and d3, respectively, no such electrical contact is made beteen the metallization layers associated with through holes 10d1 and 10c2 and the metallic plating in their vias 10e.

Figure 6:
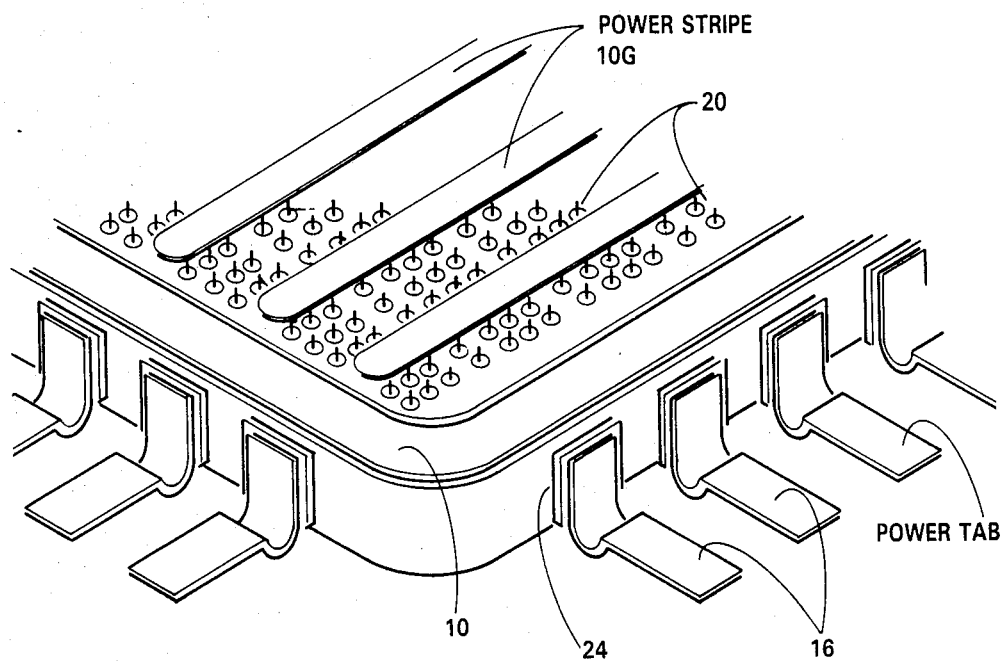
FIG. 6 illustrates a perspective view of the bottom surface of a typical module depicting a multitude of signal pins and a plurality of voltage distribution stripes, each stripe transmitting a voltage from a voltage distribution plane by way of a plated via to an integrated circuit chip by way of another plated via.

Referring to FIG. 6, a perspective view of the bottom surface of module 10 is illustrated. In FIG. 6, the bottom surface of module 10 includes a multitude of input/output signal pins 20. These pins carry the necessary signal current to the chips 10a, and are not used to power the chips 10a. The pins 20 are arranged in groups. A voltage distribution stripe 10g is disposed between adjacent groups of the pins 20 for the purpose of powering remotely-located chips 10a relative to the voltage tab 16 exposed to the voltage from the power source 14. For example, the current necessary to power a remotely located chip 10a traverses a path consisting of the voltage tab 16, brazing compound 26, metallic interface 24, the extended tab 10c1 of a voltage distribution plane 10c, a plated via 10e, a voltage distribution stripe 10g, another plated via 10e, and the solder ball 10f of the remotely-located chip 10a.

Figure 7A:
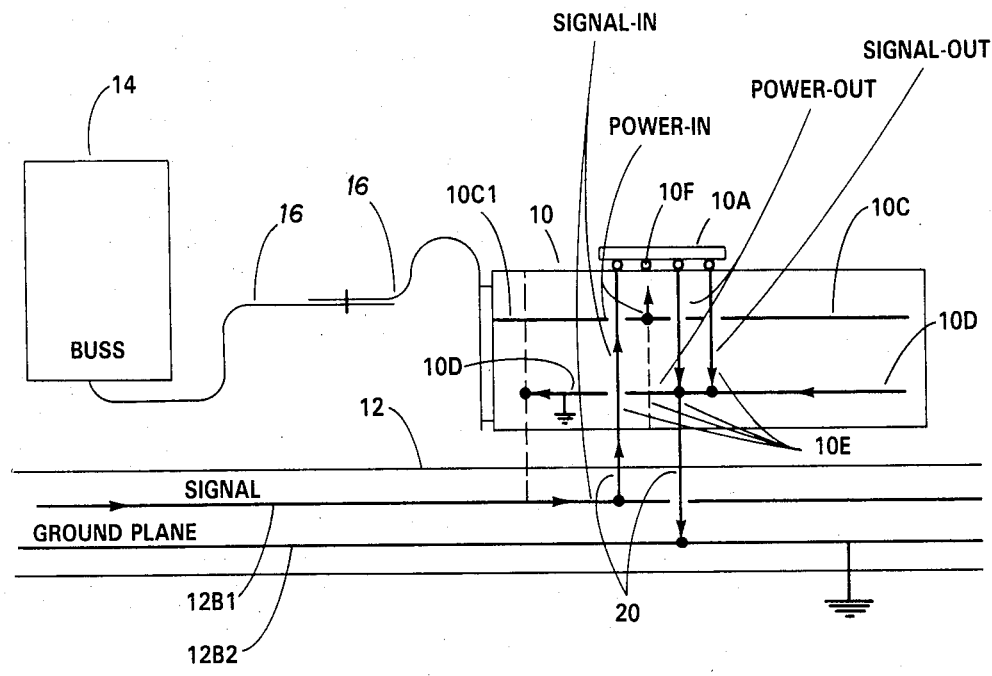
FIGS. 7a and 7b illustrate the functional operation of one embodiment of the present invention.
Figure 7B:
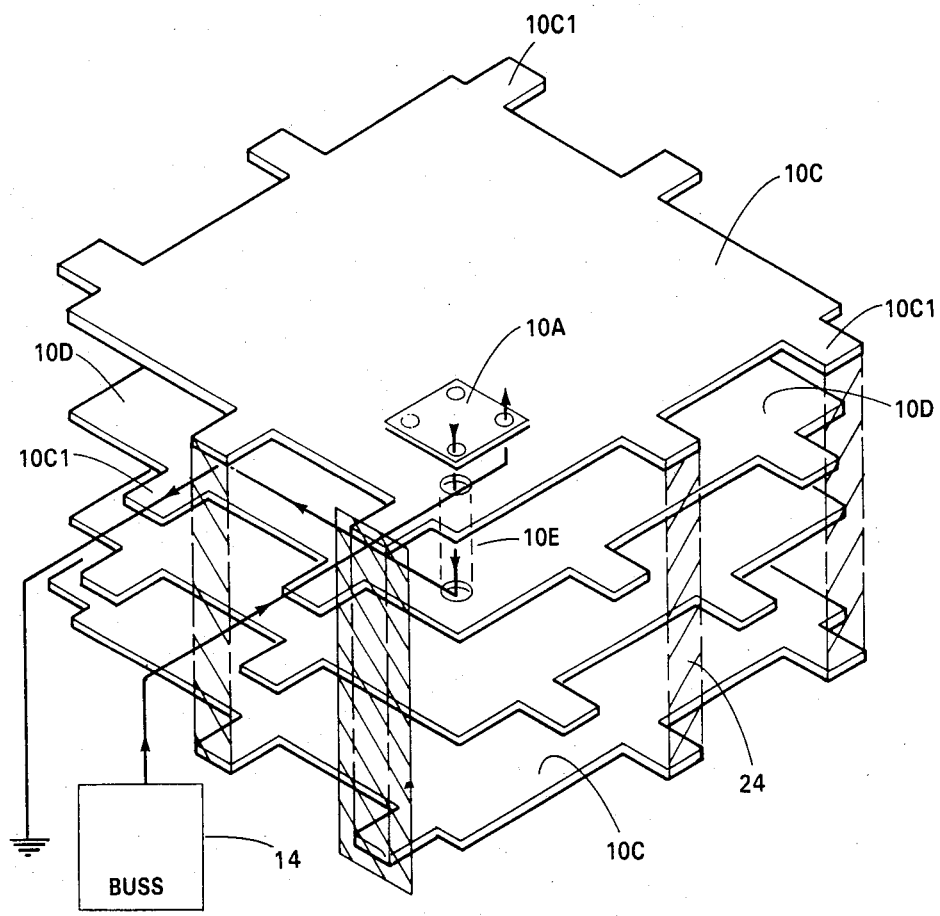

The functional operation of the present invention will be dsecribed in the paragraphs below with reference to FIGS. 7a through 7d. In FIGS. 7a and 7b, the functional operation of one embodiment of the present invention is illustrated. In FIG. 7a, module 10 is powered directly from bus 14 via voltage tab 16. The required voltage and current, needed to power the chips 10a on the module 10, traverses a path indicated in the drawing by voltage tab 16, voltage distribution layer 10c and plated via 10e. This path is annotated in the drawing by the label "power-in". The return path for the required current, to ground potential, is annotated in the drawing by the label "power-out", the return current traversing a path indicated by plated via 10e, and voltage reference layer 10d. The reference layer is connected to another tab 16 connected to ground potential. The voltage reference layer 10d is maintained at ground potential by virtue of its connection to ground plane 12b2 in the printed circuit board 12. The required signal current is provided via signal plane 12b1, the signal current provided to module 10 via a path indicated by signal plane 12b1, pin 20, plated via 10e, and solder ball 10f. The required signal current is annotated in the drawing by the label "signal-in". The signal current returns to ground potential by way of solder ball 10f, plated via 10e and voltage reference layer 10d. The return signal current is annotated in the drawing by the label "signal-out". FIG. 7b illustrates this functional operation, of this one embodiment of the present invention, in three dimensions.

Figure 7C:
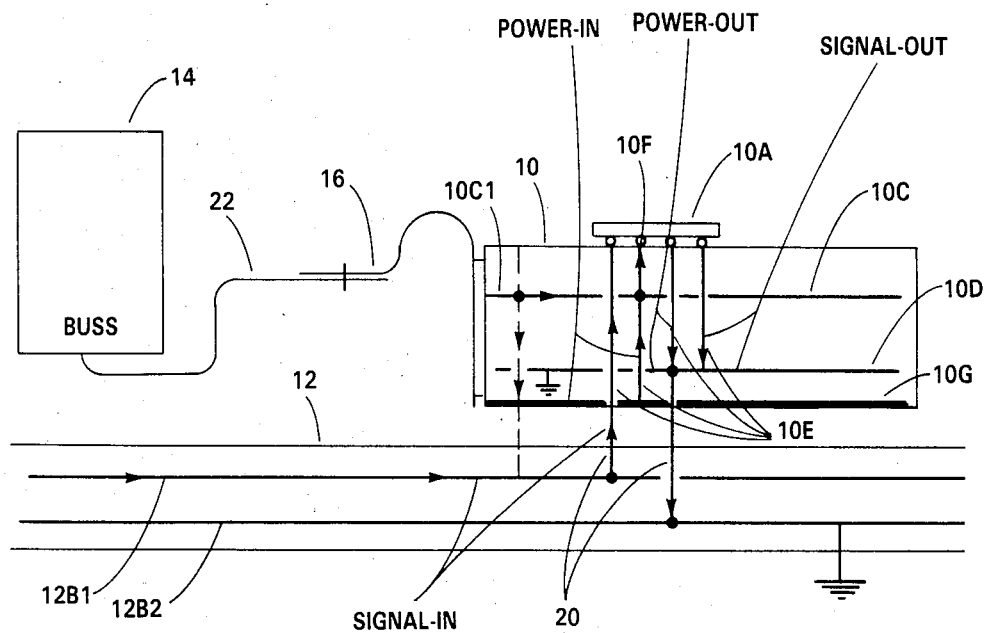
FIGS. 7c and 7d illustrate the functional operation of another embodiment of the present invention.
Figure 7D:
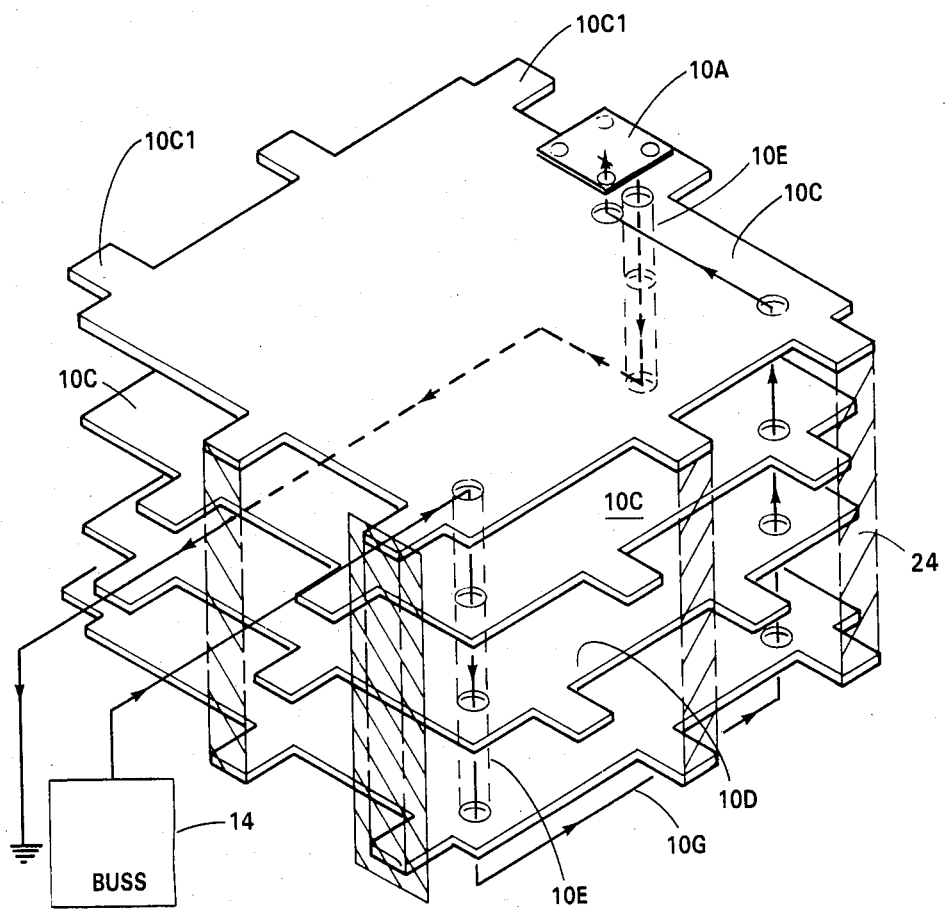

In FIGS. 7c and 7d, the functional operation of another embodiment of the present invention is illustrated. In FIG. 7c, a remotely-located module 10 is powered directly from bus 14 via voltage tab 16. The current required to power the chips 10a on module 10 traverses a path indicated by tab 16, extended tab 10c1 of voltage distribution layer 10c, plated via 10e, voltage distribution stripe 10g, another plated via 10e, and solder ball 10f. This required current is annotated in the drawing by the label "power-in". The current returns to ground potential by way of plated via 10e, voltage reference layer 10d, another extended tab 10c1, and another voltage tab 16. The return current is annotated in the drawing by the label "power-out". The voltage reference layer 10d is maintained at ground potential by virtue of ground plane 12b2 in the printed circuit board 12. The signal current required by the chip 10a on the module 10 is provided by signal plane 12b1 in board 12, the signal current traversing a path to module 10 indicated by signal plane 12b1 and plated via 10e. The required signal current is annotated in the drawing by the label "signal-in". The return path for the signal current is provided by plated via 10e, voltage reference layer 10d, another extended tab 10c1 of voltage reference layer 10d, and another voltage tab 16. The return signal current is annotated in the drawing by the label "signal-out". FIG. 7d illustrates this functional operation, of another embodiment of the present invention, in three dimensions.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

We claim:

1. A system for providing a signal current and a power current to an integrated circuit chip, comprising:
   a substrate;
   at least one integrated circuit chip mounted on a top of said substrate;
   electrical conductor means disposed within said substrate and connected to said integrated circuit chip and conducting an electric power current from an edge of said substrate to said integrated circuit chip and from said integrated circuit chip to said edge of said substrate, said electrical conductor means including a plurality of electrically conductive metalization layer means, each said metalization layer means including a body portion and a plurality of projections connected to said body portion and protruding therefrom, said integrated circuit chip being electrically connected to said metalization layer means;
   tab means connected to one of said projections of one of said metalization layer means of said electrical conductor means at said edge of said substrate and conducting said electric power current directly from a power source to said integrated circuit chip via the one projection of the one metalization layer mean of said electrical conductor means; and
   input/output pin means disposed on a bottom of said substrate and connected to said integrated circuit chip via said electrical conductor means for conducting an electric signal current to and from said chip via said electrical conductor means, said input/output pin means conducting said electric signal current to or from said integrated circuit chip, the projections of said metalization layer means conducting said electric power current to or from said integrated circuit chip.

2. The system of claim 1, further comprising:
   circuit board means connected to said substrate via said input/output pin means and conducting said electric signal current to said integrated circuit chip via said pins means and said electrical conductor means and conducting said electric signal current from said integrated circuit chip to a ground potential disposed within said board means via said electrical conductor means and said pin means.

3. The system of claim 2, wherein said circuit board means comprises:
   electric signal plane means connected to a source of signal current for conducting said electric signal current to said pin means; and
   ground plane means connected to said ground potential for conducting said electric signal current from said pin means to said ground potential.

4. The system of claim 1, wherein said electrical conductor means comprises:
   plated via means disposed orthogonally through said substrate.

5. The system of claim 1, wherein said electrical conductor means comprises:
   plated via means orthogonally disposed through said substrate; and
   electrically conductive distribution stripe means disposed along the bottom of said substrate and connecting said plated via means to said tab means at the edge of said substrate for conducting said electric power current from said plated via means to said tab means and for conducting said electric power current from said tab means to said plated via means.

* * * * *